United States Patent [19]

Trabucco

[11] Patent Number: 5,381,848
[45] Date of Patent: Jan. 17, 1995

[54] CASTING OF RAISED BUMP CONTACTS ON A SUBSTRATE

[75] Inventor: Robert T. Trabucco, Los Altos, Calif.
[73] Assignee: LSI Logic Corporation, Milpitas, Calif.
[21] Appl. No.: 121,676
[22] Filed: Sep. 15, 1993
[51] Int. Cl.[6] .............................................. B23K 3/00
[52] U.S. Cl. ................................ 164/102; 228/180.22; 228/254
[58] Field of Search ................... 228/180, 22, 253, 254; 164/98, 102

[56] References Cited

U.S. PATENT DOCUMENTS 3,628,598  12/1971  MacNeill et al. .................... 164/350
3,912,544  10/1975  Sabatino ............................... 164/102
5,244,143   9/1993  Ference et al. .................... 228/253 X Primary Examiner—Kenneth J. Ramsey
Attorney, Agent, or Firm—Honigman Miller, Schwartz and Cohn

[57] ABSTRACT

A technique for simultaneously forming large numbers of solder ball (or bump) contacts on a surface of a substrate is described. A mold is provided for receiving a substrate. Recesses in the mold are shaped to form contacts of a desired size, and are arranged to align with contact pads on the surface of the substrate. When the substrate is inserted into the mold and the mold is closed, the contact pads align with the recesses. Molten solder is introduced into the recesses and, upon cooling, forms conductive raised bump contacts on the contact pads. The substrate is then removed from the mold. Various features of the invention are directed to forming "tall" contacts with an aspect ratio (height to width ratio) of greater than 1:1, processing more than one substrate at a time, processing substrates of different sizes, and processing substrates with different contact patterns.

20 Claims, 2 Drawing Sheets

CASTING OF RAISED BUMP CONTACTS ON A SUBSTRATE

TECHNICAL FIELD OF THE INVENTION

The invention relates to semiconductor device assemblies, and more particularly to techniques for forming external connections (namely, raised ball bump type contacts) on an exterior surface of a semiconductor package.

BACKGROUND OF THE INVENTION

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the semiconductor packages, for connecting the packaged device to external systems (such as via a printed circuit board). Traditional packaging techniques involving pins, leads and the like are inadequate to the task.

A number of newer interconnection technologies have been used, with varying degrees of success, to increase connection densities above those of older techniques (e.g., the relatively low-density DIP or Dual Inline Package connection technique). These newer techniques are represented primarily by solder-reflow surface-mount technologies such as: PQFP (Plastic Quad Flat Pack), SOIC (Small Outline Integrated Circuit), LCC's (Leadless Chip Carriers), J-lead packages, etc., although a few high-density non-surfacemount techniques (e.g., PGA—Pin Grid Array) have also been used. Among the newer surface mounting techniques is a type of package on which a plurality of ball-shaped conductive bump contacts (usually solder, or other similar conductive material) are disposed. Such packages are occasionally referred to as "Ball Grid Array" (BGA) or "Area Grid Array" packages—the solder balls on the exterior surface of the package typically being arranged in a rectangular array.

A typical BGA package is characterized by a large number (potentially several hundreds) of solder balls disposed in an array on a surface of the package. The BGA package is assembled to a matching array of conductive pads (presumably connected to other circuitry) on a substrate or circuit board. Heat is applied to reflow the solder balls (bumps) on the package, thereby wetting the pads on the substrates and, once cooled, forming electrical connections between the package (and the semiconductor device contained in the package) and the substrate.

The introduction of the Ball Grid Array (BGA) package to the semiconductor industry has brought with it several new package manufacturing and assembly problems. One of the more significant problems is finding an efficient, cost-effective technique for applying the solder ball contacts to the package surface. The package surface is usually formed from an electrically insulating material (e.g., printed circuit board material) with a pattern of metallized pads disposed thereupon connecting to circuity on a semiconductor device within the package. Several methods are currently used to dispose solder balls or conductive bump contacts to these package pads.

One method of disposing solder balls or conductive bump contacts on package pads involves the application of solder flux to the package pads, then placing preformed solder balls onto the package pads, either individually or en masse, with the aid of a fixture or a "pick-and-place" apparatus similar to those used for circuit board assembly. The package is then heated to the melting point of the solder ball alloy which will then wet the metallic surface of the pads and make electrical contact therewith.

This pick-and-place method requires the precision handling of massive quantities of solder balls. As the connection counts of packages increase, hundreds or even thousands of balls must be manipulated in this fashion for each package.

An alternative method of disposing solder balls or conductive bump contacts on package pads involves using a printing or dispensing fixture to apply measured quantities of solder paste (a mixture of fine solder particles in a flux-containing medium) to the package contact pads. Upon exposure to heat, the solder melts and surface tension causes the solder to assume a generally spherical shape. Once cooled, the spherical shapes form the "ball grid" contacts of the package. Evidently, ball bump type contacts formed in this manner, being generally spherical, will exhibit a 1:1 aspect ratio of height-to-width. Even if hemispherical, the ball bump type contacts will have a height:width ratio on the order of 0.5:1. In certain applications, it would be desirable that the external package contacts have a height:width ratio in excess of 1:1 (e.g., 2:1).

Another technique for disposing solder balls or conductive bump contacts on package pads involves using printed solder paste, then placing a preformed ball, which is essentially a combination of the two techniques described hereinabove. In this technique, solder is printed onto the contact pad to form an "adhesive" on the contact pad, then a pre-formed solder ball is placed onto the contact pad.

Difficulties with the technique of measuring or dispensing quantities of solder paste on pads to form ball bump contacts include dealing with the rheological characteristics (elasticity, viscosity, plasticity) of the solder paste, accurately controlling the volume of solder paste after dispensing and reflow, and the shape of the final ball contact. The shape of the ball contact can be affected by such factors as surface tension of the molten solder and the amount of wettable exposed metal area of the contact pad.

The generally spherical shape assumed by solder balls formed as described hereinabove prevents the formation of "tall" contacts by ordinary means. In certain applications, tall solder bumps or ball contacts can be used to great advantage in reflow assembly (e.g., of a packaged semiconductor device to a printed circuit board). As mentioned above, in general it is difficult to form contacts with height-to-width ratios (aspect ratios) of greater than 1:1. Some techniques involving "building up" of solder contact height in a series of process steps have managed to produce tall contacts, but such techniques are expensive and cumbersome in high-volume production.

Consistency in the height of solder ball contacts is another critical factor for successful assembly of BGA-type packages to circuit boards. If one or more balls are significantly shorter than others (usually due to an insufficient amount of solder paste deposited on one or more conductive pads prior to contact formation) it becomes highly likely that these smaller (shorter) contacts will completely miss their mating contact pads (on the circuit board) and will fail to form an electrical connection between the packaged semiconductor device and the underlying substrate (e.g., printed circuit board). Hence, quality control for BGA packages is critical, since proper electrical connections between the BGA package and the substrate to which it is assembled are formed only if each and every one of the solder ball contacts reflows correctly and wets its associated conductive pad on the substrate. Defective assemblies of packages to substrates can be difficult or impossible to repair after assembly if connections are not properly formed. Even prior to assembly, the correction of improperly formed solder ball type contacts on the exterior of a package can be very difficult and involves, initially, careful quality control inspection of the ball bump contacts prior to assembly of the packaged device to a substrate.

As the volume of packages produced by the aforementioned methods increases, the complexity of the manufacturing processes becomes an obstacle to high manufacturing rates. In order to avoid high scrap rates, high machine accuracy must be maintained, raw material properties (e.g., solder paste and pad metal) must be carefully controlled, and numerous process parameters (e.g., amount of solder paste dispensed, size of conductive pads, temperature, shape and size of ball contact) must be monitored.

Further complicating matters, in order to accommodate different package configurations (e.g., different size packages, different array spacing of the ball bump contacts, etc.), it may be necessary to change numerous parts of the manufacturing equipment (tooling). Generally speaking, complicated setup and tooling changes tend to increase downtime, thereby increasing production cost.

DISCLOSURE OF THE INVENTION

It is therefore an object of the present invention to provide an improved technique for forming conductive ball (or bump) contacts on a surface of a substrate. Generally, hereinafter, although "balls" may be referred to, it should be understood that other, non-spherical geometries of raised solder contacts ("bumps") are intended.

It is a further object of the present invention to provide a technique suited to forming large numbers of conductive ball contacts on a surface of a substrate.

It is another object of the present invention to provide a technique for forming a large number of conductive ball (or bump) contacts on a substrate simultaneously.

It is another object of the present invention to provide a technique for forming large numbers of conductive ball (or bump) contacts of uniform height.

It is another object of the present invention to provide a technique for forming high aspect (height:width) ratio conductive ball (or bump) contacts.

It is another object of the present invention to accomplish the foregoing objects in a minimum number of process steps.

It is another object of the present invention to accomplish the foregoing object in a process which requires a minimal amount of manufacturing time.

It is another object of the present invention to accomplish the foregoing objects inexpensively.

It is another object of the present invention to provide a technique which accomplishes the foregoing objects in a manner suited to high-volume production.

According to the invention, raised conductive bump contacts are formed on a surface of a substrate by direct casting or molding of the contacts. This is accomplished by providing a mold which has a shaped recess or cavity for each contact to be formed on a surface of a substrate. The substrate, upon which the bump contacts are to be formed, has a plurality of conductive (preferably metallic) contact pads disposed on its surface, and the recesses in the mold are provided in a like plurality and are positioned in a matching configuration. The substrate is disposed within the mold such that the conductive contact pads are aligned with and cover the recesses in the mold (or vice-versa, depending on how viewed). The mold is closed over the substrate and a molten solder alloy is introduced (preferably forced, under pressure) into the recesses via orifices communicating with the recesses. The molten solder wets and adheres firmly to the corresponding conductive contact pads. The molten solder alloy is permitted to cool until it hardens and the mold is opened. The hardened solder alloy remains on the contact pads in the shape of the recesses of the mold.

According to an aspect of the invention, the mold comprises two mold halves, one of which receives the substrate and the other of which has the contact-forming recesses. By changing the recess-bearing mold half, different contact configurations (i.e., spacing, density, absolute number, geometry, height) can be accommodated on otherwise similar packages.

According to another aspect of the invention, the mold is adapted to receive more than one substrate. In this case the recess-bearing mold half has contact-forming recesses for each substrate. The contact configurations and shapes need not be the same for all of the substrates in the mold, i.e., each substrate can have a different size, number of contacts, and contact shape.

According to another aspect of the invention, the contact-forming recesses can be shaped to form contacts with an aspect ratio (height-to-width ratio) of greater than 1:1. For example, cylindrical raised contacts can be formed, which can exhibit a height-to-width ratio in excess of 1:1.

Preferably, all of the contact-forming recesses in the mold (i.e., in the mold half having the recesses) are identical in depth so that all of the contacts formed by the matched-depth recesses are of identical height.

The technique of the present invention is well suited to handling large numbers of solder bump contacts at low cost, with a minimal number of process steps. By casting (molding) the contacts directly onto a substrate it is possible to ensure uniform contact height. By controlling the size and shape of the contact-forming recesses in the mold, it is possible to create contact structures having virtually any desired aspect ratio (height-to-width ratio).

Since all of the raised contacts are formed simultaneously on the exterior of the package, and since they are all applied to the surface of a package substrate at once, the inventive technique is ideally suited to high-volume, low-cost production.

Other objects, features and advantages of the invention will become apparent in light of the following description thereof.

DETAILED DESCRIPTION OF THE INVENTION

The present inventive technique is directed to applying contacts to a substrate, e.g., a semiconductor package, a circuit board or other substrate, using mass production techniques. The technique requires minimal tooling changes to accept various package configurations and lead arrangements.

According to the invention, a mold having at least two halves is provided. One half of the mold is designed to receive one or more substrates. The other half of the mold is provided with a plurality of contact-forming recesses. One or more substrates are placed into the substrate-receiving half of the mold. The substrate(s) has (have) conductive (preferably metallic, e.g., copper) contact pads disposed on a surface thereof, and are inserted into the substrate-receiving mold half such that the surface having the contact pads is exposed. The recesses in the recess-bearing half of the mold are arranged in a pattern corresponding to the positions of the contact pads on the package substrate(s). The shape of the recesses forms the final (intended) shape of the contacts to be formed. The size of each recess determines the volume of solder alloy for each contact. Each recess is provided with a small orifice or passage leading to a reservoir of molten solder alloy.

The recess-bearing mold half is positioned (closed) over the contact pad bearing surface(s) of the substrate(s) such that the contact pads are aligned with the recesses. Preferably, the contact pad bearing surface(s) of the substrate(s) is (are) previously treated with a thin coating of solder flux (which will aid in wetting of the contact pads by molten solder) prior to closing the recess-bearing mold half over the substrate(s). A molten solder alloy is caused to flow into the recesses of the closed mold by piston, feed auger, or other suitable method of introduction, such as those techniques used in die casting of metals such as zinc, aluminum, or magnesium. The solder wets the contact pads and adheres firmly to them.

After the molten solder alloy fills the recesses, the flow of metal is stopped and the mold and solder are permitted to cool until the solder hardens. Since most suitable solder alloys (e.g., tin-lead alloys) have a very narrow plastic range, or are eutectic alloys, they will solidify quickly with minimum cooling of the mold (i.e., small temperature drop), thereby taking on the shape of the recesses to form raised conductive bump contacts on the contact pads. The mold is then opened and the substrate(s) is (are) removed. The hardened solder alloy bump contacts remain on the substrate. Any remaining flux residue is cleaned off of the substrate(s), as required.

Figure 1:
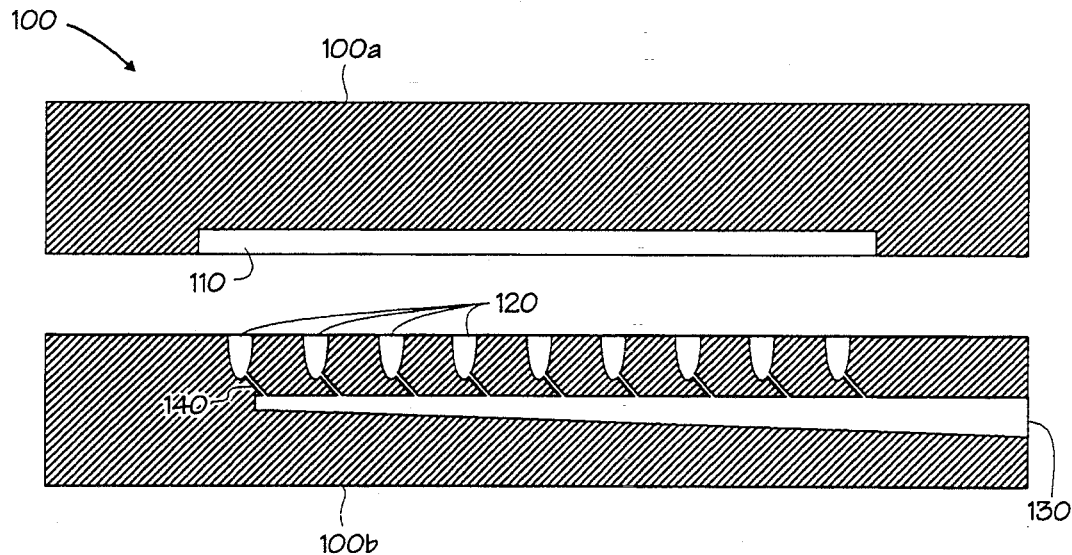
FIG. 1 is cross-sectional view of molding apparatus comprising two mold halves for forming conductive bump contacts on a surface of a substrate (e.g., an external surface of a semiconductor package body), according to the invention.

FIG. 1 is an exploded, cross-sectional view of separated halves of a mold 100 for forming conductive bump contacts on a substrate, according to the invention. A first mold half 100a has a cavity 110 for receiving a substrate. A second mold half 100b has a plurality of contact-forming recesses 120 arranged in any suitable (desired) pattern. The recesses are shaped to form contacts on the substrate of a desired shape and size. A chamber (runner) 130 in the contact-forming mold half 100b is provided for introduction of molten solder alloy into the recesses 120. Each recess 120 communicates with the chamber 130 by a small passage 140.

Figure 2:
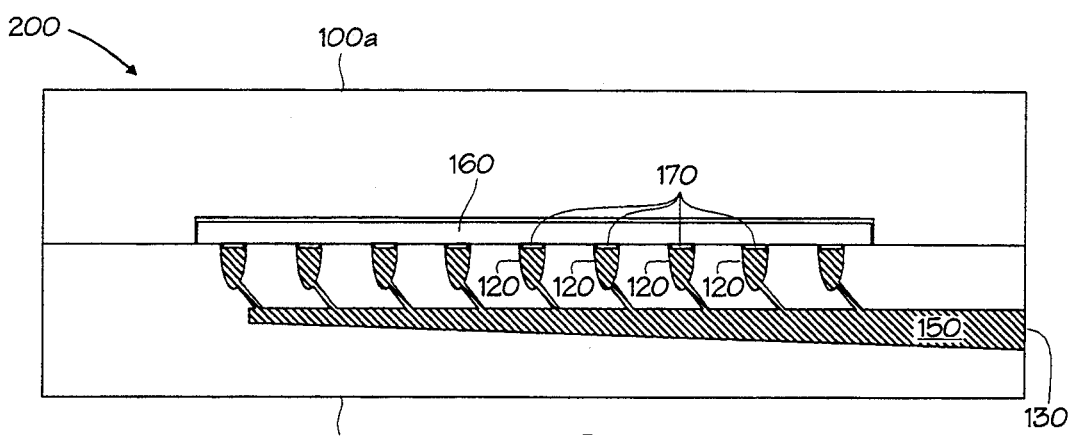
FIG. 2 is cross-sectional view of a the mold halves of FIG. 1 enclosing a substrate during contact formation, according to the invention.

FIG. 2 is a cross-sectional view 200 of the two mold halves 100a and 100b assembled around a substrate 160. The substrate 160 fits into the cavity 110 of the substrate-receiving mold half 100a. (The shading of the mold halves 100a and 110b is eliminated in this view to avoid illustrative clutter). The substrate 160 has a plurality of conductive contact pads 170 disposed on a surface thereof, and has been inserted into the substrate-receiving mold half 100a such that the surface with the contact pads 170 is exposed to the contact-forming recesses 120 in the contact-forming mold half 100b. The contact pads 170 are formed on the substrate 160 prior to the molding process of this invention. Preferably, a light coating of solder flux is applied to the contact pads 170 (by coating the surface of the substrate 160) prior to enclosing the substrate in the mold. The recesses 120 are arranged in a pattern to match the pattern of the contact pads 170. Each conductive contact pad 170 on the substrate 160 has a corresponding recess 120 in the contact-forming mold half 100b. Molten solder 150 is introduced (from a supply reservoir, not shown) into the recesses 120 via the chamber 130, by any suitable means. The molten solder 150 flows through the runner 130, through the orifices 140, into the recesses 120, wets the contact pads 170 and adheres firmly to them. As the molten solder 150 cools, it hardens in the shape of the recesses 120 and adheres to the contact pads, forming raised electrical contacts on the contact pads 170.

Figure 3:
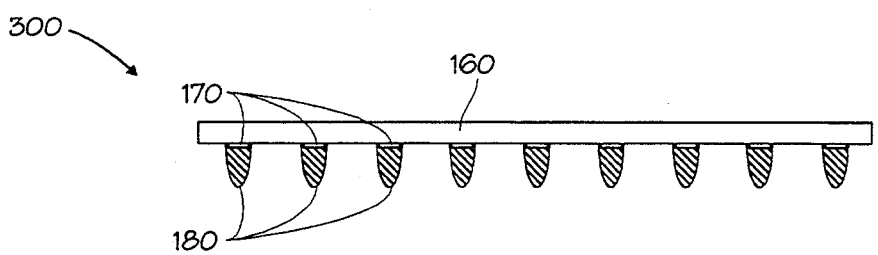
FIG. 3 is of the substrate after removal from the mold halves, according to the invention.

After cooling, the mold halves 100a and 100b are separated and the substrate 160 is removed. FIG. 3 is a view of the resulting structure 300, after removal from the mold, showing molded conductive solder contacts 180 on each contact pad 170. In this example, since all of the recesses 120 are of the same depth, all of the resulting raised contact structures 180 on the substrate 160 will be of the same (uniform) height. Also, as intended to be illustrated by FIG. 3, by molding (casting) the raised conductive contact structures 180 on the surface of the substrate, the contact structures 180 can be formed with virtually any desired height or shape. Height-to-width ratios for the contact structures in excess of 1:1 are readily achieved.

FIGS. 1–3 generally show the inventive technique for forming raised contact structures on the surface of a substrate. The techniques of the present invention are also applicable to forming raised contact structures on the surfaces of two or more substrates. This is shown and described with respect to FIGS. 4a and 4b.

Figure 4A:
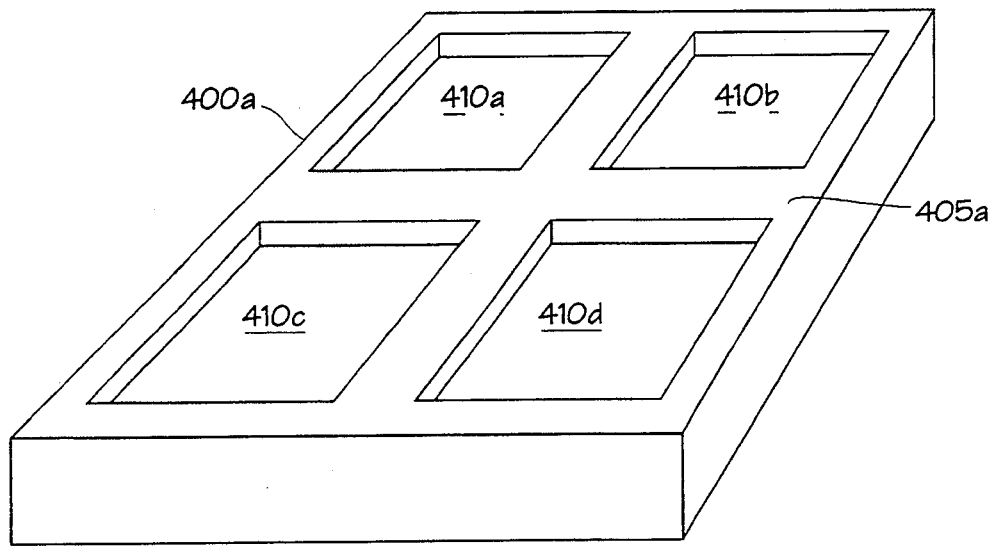
FIGS. 4a and 4b are perspective views of substrate-receiving and contact-forming recess-bearing mold halves, respectively, according to the invention.

FIG. 4a is a perspective view of a substrate-receiving mold half 400a, according to the invention, suited to receiving a plurality of substrates (four shown, any number possible). Four substrate-receiving cavities 410a, 410b, 410c, and 410d are formed in a surface 405a of the mold half 400a. The cavities are sized to fit a substrate of a pre-determined size. All of the cavities shown (410a–d) are the same size. However, by providing cavities of different sizes, substrates of different sizes may readily be accommodated in a single mold. This is particularly advantageous when a number of different substrates must be produced in proportional quantities, such as for electronic assemblies which include one of a first substrate, two of another, etc.. The mold can be set up to produce a "matched set" of substrates.

Figure 4B:
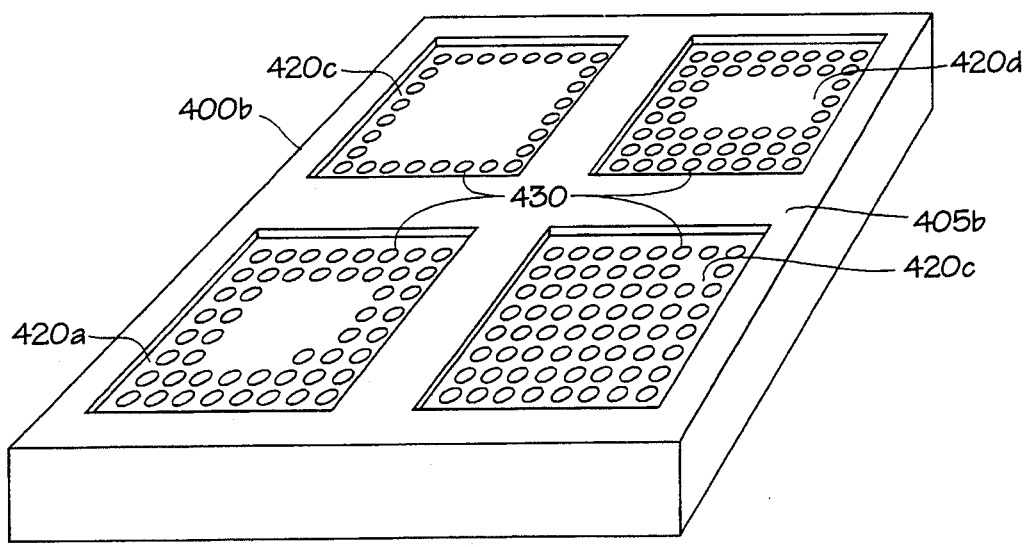

FIG. 4b is a perspective view of a cavity-forming mold half 400b corresponding to the substrate-receiving mold half 400a of FIG. 4a. Contact-forming recesses 430 are formed in a surface 405b of the contact-forming mold half 400b in four areas 420a, 420b, 420c, and 420d, corresponding to and positioned to align with the substrate receiving cavities 410a, 420b, 420c, and 420d. The configuration of the recesses 430 in the four areas 420a–d corresponds to a pattern of contact pads on substrates on which conductive bump contacts are to be formed, as shown in FIG. 2, and need not be the same for each substrate, as shown in the Figure.

It will readily be appreciated by one of ordinary skill in the art that many different techniques are known for molding structures on a surface, any of which may be employed in the inventive technique. Further, it will be evident to one of ordinary skill in the art that details which are not essential to the inventive technique (e.g., index pins, ejectors, etc.) have been omitted from the drawings and description for simplicity, and that such details may readily be incorporated without undue experimentation.

It will also be evident to one of ordinary skill in the art that if it is necessary to accommodate a different contact configuration (e.g., because of a change in the pattern of contact pads on a substrate due to a design change, or a different pattern of contact pads on a completely different substrate of the same size) that it is only necessary to change the contact-forming mold half for another contact-forming mold half with a recess pattern designed for the different contact configuration.

Although the molds shown and described hereinabove are formed of two halves, it is within the spirit and scope of the invention to employ multi-part molds, as desired, to facilitate unusual contact shapes, to facilitate insertion and/or removal of the substrate, to facilitate ejector design, etc..

According to an aspect of the invention, "tall" contacts (bump contacts having a height to width ratio of greater than 1:1) can be formed by providing "deep" recesses to form them. The shape and height of the contacts is limited only by the ability of the molding technology to fill the recesses effectively.

By providing tall contacts, greater spacing between the substrate and another substrate or printed circuit board (when assembled by re-flow soldering). This greater spacing facilitates flux removal, and permits air or coolant flow between the substrates. Further, the taller contacts can better accommodate mismatched TCE's (thermal coefficients of expansion) in a re-flow assembly, providing a measure of strain relief.

The technique of the present invention is well suited to handling large numbers of solder bump contacts at low cost, with a minimal number of process steps. By casting of the contacts directly onto a substrate it is possible to ensure uniform contact height. By controlling the size and shape of the contact-forming recesses in the mold, it is possible to create contact structures having virtually any aspect ratio (height to width ratio) or shape.

Since all of the contacts are formed simultaneously, and since they are all applied to the surface of a substrate at once, the inventive technique is ideally suited to high-volume, low-cost production. Production rate is essentially independent of the number of contacts formed on the substrate(s).

As compared to the prior-art technique of installing preformed solder balls on a substrate, the present invention dramatically improves material handling and cost, since the contacts are simply molded from bulk solder. Further, a faulty substrate (e.g., bad contact formation) can be readily reprocessed, simply by re-inserting it into the mold. Because of the very narrow plastic temperature range of most solders, it is not necessary to subject the mold to large temperature changes to cause the solder to flow and to harden. It is only necessary to elevate the temperature a small amount to cause the solder to flow, and to reduce the temperature a small amount to cause it to harden.

What is claimed is:

1. A method of forming raised solder contacts on a surface of a substrate, comprising:
   providing a substrate having a surface;
   providing conductive contact pads arranged in a pattern on the surface of the substrate;
   providing a mold for receiving the substrate;
   providing a plurality of recesses in the mold, said recesses shaped and fixed to form contacts of a predetermined shape and size and arranged in a pattern corresponding to the pattern of the contact pads, said mold including integral means for introducing molten solder into the recesses, said solder introducing means having openings into said recesses smaller than said recesses;
   inserting the substrate into the mold such that the contact pads align with corresponding recesses;
   introducing molten solder into the recesses;
   allowing the molten solder to solidify; and
   removing the substrate from the mold.

2. A method according to claim 1, further comprising:
   cooling the mold after introduction of the molten solder into the recesses to harden the solder.

3. A method according to claim 1, further comprising:
   applying solder flux to the contact pads prior to inserting the substrate into the mold.

4. A method according to claim 3, further comprising:
   cleaning flux residue from the substrate after removing the substrate from the mold.

5. A method according to claim 1, further comprising:
   cleaning the substrate with a suitable cleaning solution after removing it from the mold.

6. A method according to claim 1, wherein:
   at least a portion of the recesses are shaped to form contact structures with a height-to-width aspect ratio greater than 1:1.

7. A method according to claim 1, wherein:
   the recesses are shaped to form contact structures with a uniform height-to-width aspect ratio greater than 1:1.

8. A method according to claim 1, wherein:

at least a portion of the recesses have uniform depth to form contact structures of uniform height.

9. A method according to claim 1, wherein:
the recesses have uniform depth to form contact structures of uniform height.

10. A method of forming solder contacts on a plurality of substrates, comprising:
providing a plurality of substrates;
providing conductive contact pads on a surface of each of the substrates;
providing a mold for receiving the substrates;
providing a plurality of recesses in the mold, said recesses shaped and sized to form contacts of a predetermined shape and size and arranged to align with the contact pads on the substrates, said mold including integral means for introducing molten solder into the recesses, said solder introducing means having openings into said recesses smaller than said recesses;
inserting the substrates into the mold such that the contact pads align with corresponding recesses;
introducing molten solder into the recesses;
allowing the molten solder to solidify; and
removing the substrates from the mold.

11. A method according to claim 10, further comprising:
cooling the mold after introduction of the molten solder into the recesses to harden the solder.

12. A method according to claim 10, further comprising:
applying solder flux to the contact pads prior to insertion of the substrates into the mold.

13. A method according to claim 12, further comprising:
cleaning flux residue from the substrates after removal from the mold.

14. A method according to claim 10, further comprising:
cleaning the substrates with a suitable cleaning solution after removal from the mold.

15. A method according to claim 10, wherein:
at least some of the recesses are shaped to form contact structures with an aspect ratio of greater than 1:1.

16. A method according to claim 10, wherein:
at least a portion of the recesses have uniform depth to form contact structures of uniform height.

17. A method according to claim 10, wherein:
the contact pads are arranged on each of the substrates in an identical pattern.

18. A method according to claim 10, wherein:
the contact pads are arranged on the different patterns on different substrates.

19. A method according to claim 10, wherein:
the substrates are all of a uniform size.

20. A method according to claim 10, wherein:
at least one of the substrates has a size which differs from that of the other substrates.

* * * * *